Sept. 1, 1970 K. R. SKINNER ET AL 3,526,707

FINE TUNING INDICATOR

Filed April 11, 1967 4 Sheets-Sheet 1

Sept. 1, 1970 K. R. SKINNER ET AL 3,526,707

FINE TUNING INDICATOR

Filed April 11, 1967 4 Sheets-Sheet 2

WITNESSES

Bernard R. Gieguey

James F. Young

INVENTORS

Kenneth R. Skinner and Jing-Jue Young.

BY

ATTORNEY

Sept. 1, 1970 K. R. SKINNER ET AL 3,526,707

FINE TUNING INDICATOR

Filed April 11, 1967 4 Sheets-Sheet 3

United States Patent Office 3,526,707

Patented Sept. 1, 1970

3,526,707
FINE TUNING INDICATOR

Kenneth R. Skinner, Metuchen, and Jing-Jue Young, Elizabeth, N.J., assignors to Westinghouse Electric Corporation, Pittsburgh, Pa., a corporation of Pennsylvania Filed Apr. 11, 1967, Ser. No. 629,997
Int. Cl. H04n 5/50
U.S. Cl. 178—5.8 9 Claims

ABSTRACT OF THE DISCLOSURE

The present disclosure relates to a fine tuning indicator circuit to aid in the exact fine tuning of a television receiver, especially a color receiver. Control signals are generated in the indicator circuit and are utilized to display a control line on the picture tube indicative of the fine tuned state of the receiver. Reference signals are also generated to display a reference line on the picture tube. By adjusting the fine tuning control of the receiver, the control line may be brought into alignment with the reference line thus indicating proper fine tuning adjustment.

BACKGROUND OF THE INVENTION

The present invention relates to tuning indicators and, more particularly, to fine tuning indicators for use in television receivers.

A fine tuning control is provided in television receivers for precisely tuning to the frequency of a received television signal after the desired channel has been selected. The fine tuning control is normally provided in the tuner of the receiver and is operative to tune accurately the tuning circuits of the tuner and the local oscillator. Fine tuning control is usually provided for both the VHF and UHF portions of the tuner. For high quality picture reproduction, it is, of course, necessary that the receiver be accurately fine tuned as nearly as possible to the frequency of the received television signal. This is especially important for color reception where color information may be entirely lost due to inaccurate fine tuning of the receiver. It would therefore be highly desirable from a user's standpoint to provide a visual indication that proper fine tuning of the television receiver has been accomplished. It would moreover be highly desirable if the visual indication were such to indicate the degree of mistuning and the direction of rotation of the fine tuning control required to effect proper fine tuning.

SUMMARY OF THE INVENTION

It is therefore an object of the present invention to provide a new and improved fine tuning indicator for use in a television receiver.

It is a further object to provide a fine tuning indicator which provides a visual display of the tuned condition of a television receiver.

It is a further object to provide a fine tuning indicator for use in a television receiver which utilizes the picture tube of the receiver as the visual indication of fine tuning.

It is still a further object to provide a fine tuning indicator for use in a television receiver wherein a visual display of the fine tuned state of the receiver is provided and wherein the direction of adjustment for proper tuning is indicated. Broadly, the above-cited objects are accomplished by providing a fine tuning indicator for use in a television receiver wherein: reference signals are generated having a predetermined time position in the horizontal scanning period of the receiver, and control signals are generated having a variable position in the horizontal scanning period, the variable position of the control signals being determined by the fine tuning control of the receiver. The reference signals and control signals are generated during alternate picture fields of scan, with the reference and control signals being applied to the picture tube with a reference line and a control line being displayed thereon. The position of the control line is movable in response to the fine tuning control of the receiver so as when the control line is aligned with the reference line, proper fine tuning of the receiver is indicated thereby. The misalignment of the control line from the reference line is indicative of mistuning and the direction of adjustment required for proper adjustment of the receiver.

BRIEF DESCRIPTION OF THE DRAWINGS

These and other objects and advantages of the present invention will become more apparent when considered in view of the following specification and drawings, in which.

DESCRIPTION OF THE PREFERRED EMBODIMENT

Figure 1:
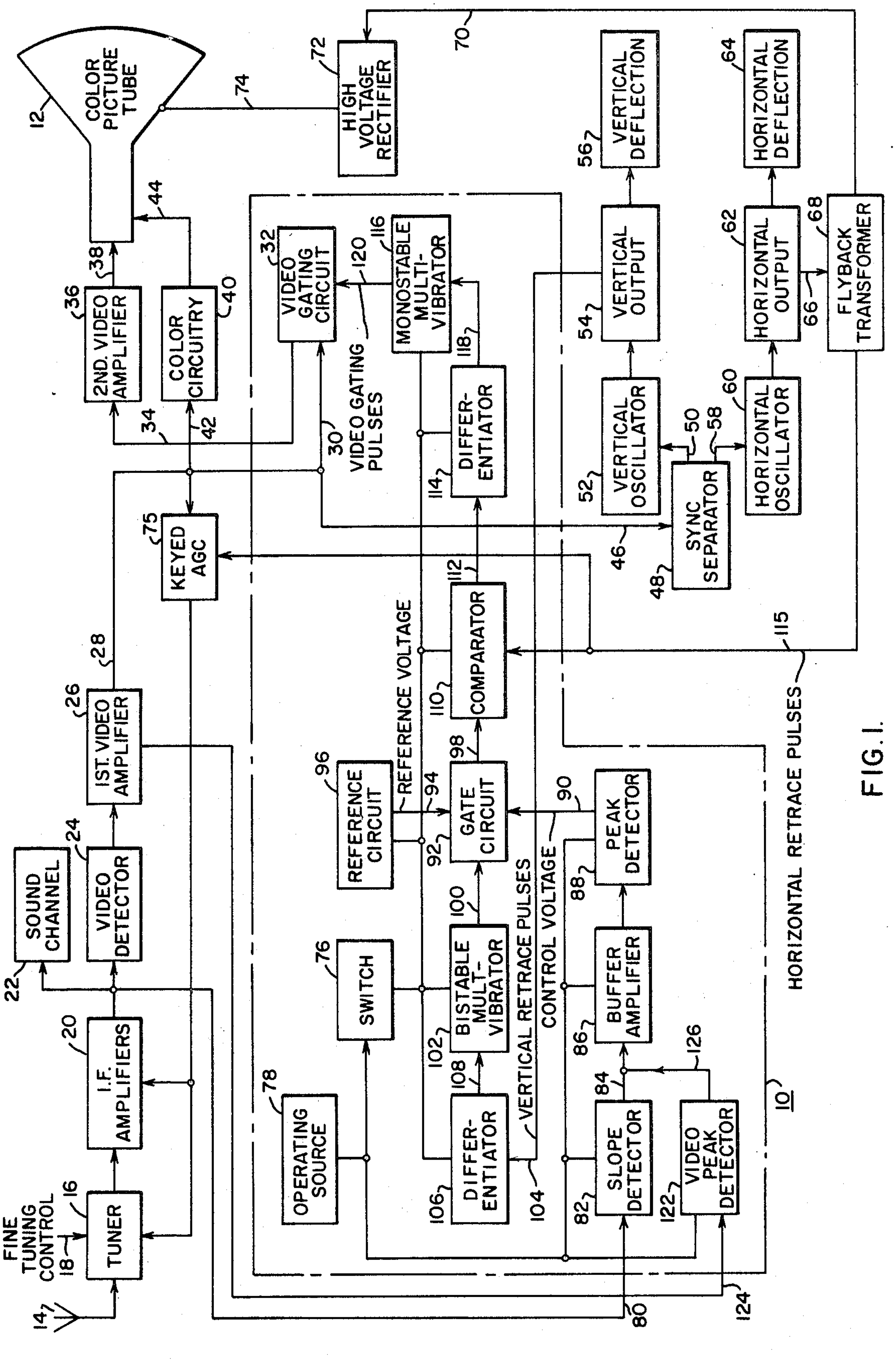
FIG. 1 is a block diagram showing the fine tuning indicator of the present invention included in a television receiver.

Referring now to FIG. 1, the fine tuning indicator of the present invention is shown incorporated into an otherwise standard television receiver. The components which make up the fine tuning indicator are enclosed within a dotted block 10. The blocks shown on FIG. 1 otherwise comprise standard television receiver circuitry. The block diagram as shown is that of a color receiver utilizing a color picture tube 12, however, it should be understood that the fine tuning indicator could be used on a monochrome receiver. Incoming television signals are received by an antenna 14 and applied to a tuner 16 with the tuner 16 being set to a selected channel in either the VHF or UHF frequency band. A fine tuning control, indicated schematically by an input 18 is provided as a standard component of the tuner 16 as is standard practice. The incoming television signal is heterodyned in the tuner with a signal generated by a local oscillator to provide intermediate frequency signals which are applied to a plurality of intermediate frequency amplifier stages indicated by a block 20. Typically, there may be two or three intermediate frequency amplifying stages. The output of the IF amplifier 20 is applied to a sound channel 22 wherein the audio portion of the television signal is demodulated to provide the sound output of the receiver.

The output of the IF amplifiers 20 is also applied to a video detector 24 wherein the video portion of the television signal is detected, as is well known in the art, and then applied to a first video amplifier 26 for amplification therein. The output 28 of the first video amplifier is usually applied to another stage of video amplification and then applied to the cathode circuit of the picture tube of the receiver. However, as shown in FIG. 1, the output 28 is applied via a lead 30 to a video gating circuit 32 of the fine tuning indicator 10. The video gating circuit 32 performs a switching function to either permit the passage of the signal appearing at the output 28 therethrough or to block this output from appearing at an output lead 34 thereof which is applied as the input to a second video amplifier 36. The video gating circuit 32 will be discussed in further detail below. The output 38 of the second video amplifier 36 is applied as the luminance input to the color picture tube 12 in the normal fashion.

The output 28 of the first video amplifier 26 is also applied to the color circuitry of the receiver which is indicated by a block 40 via a lead 42 connected to the output 28. If color information is contained in the received television signal, the color circuitry 40 demodulates this information and applies it via an output 44 to the color picture tube 12 according to standard practice.

The first video amplifier 26 also has an output 46 which is applied to a synch separator 48 which is operative to separate the vertical and horizontal synchronizing pulses from the received television signal. The vertical synchronizing pulses are then applied from an output 50 of the synch separator 48 to a vertical oscillator 52, which, in turn, drives a vertical output circuit 54. The output of the vertical circuit 54 is applied to the vertical deflection circuit 56 of the television receiver. At an output 58 of the synch separator 48, horizontal synchronizing pulses are supplied and applied to a horizontal oscillator 60 which provides an output at the horizontal scanning rate of the receiver to a horizontal output circuit 62. The horizontal output circuit 62 provides the horizontal scanning waveform to the horizontal deflection circuit 64 of the receiver. The horizontal output also supplies an output 66 to a flyback transformer 68 for the development of the high voltage supply for the television receiver at an output 70 thereof. The high voltage output of the flyback transformer 68 is rectified in a high voltage rectifier 72 which supplies high voltage via a lead 74 to the anode of the color picture tube 12.

A keyed automatic gain control circuit 75 is provided to control the gain of the tuner 16 and IF amplifiers 20 of the receiver. The keyed AGC circuit 75 receives an input from the output of the 1st video amplifier 26 which is indicative of the amplitude of the incoming television signal and is keyed on by flyback pulses supplied thereto by the flyback transformer 68. The output of the keyed AGC circuit is then applied to the tuner 16 and IF amplifier stages 20 to control their output levels as is well known in the art.

Figure 2A:
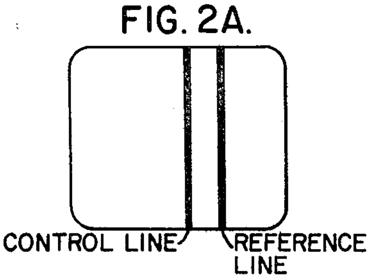
FIGS. 2A, 2B and 2C are pictorial diagrams showing the display provided by the fine tuning indicator on the picture tube of the television receiver.
Figure 2B:
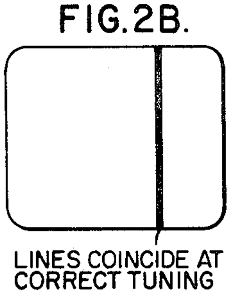
Figure 2C:
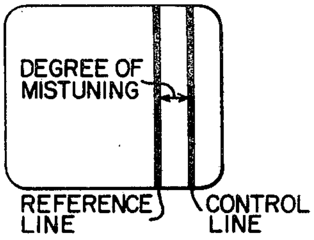

Except for the video gating circuit 32, the circuitry described above comprises a standard television receiver and otherwise functions in the normal fashion for such a receiver. The inclusion of the stages shown within the dotted block 10 permits display of a reference line and a movable control line on the screen of the picture tube 12 such as indicated in FIGS. 2A, 2B and 2C. The operation of the fine tuning indicator 10 will now be discussed.

The fine tuning indicator 10 is only operative when it is desired to fine tune the receiver to the carrier frequency of the incoming television signal. A switch 76 is provided for disconnecting an operating source 78, which may comprise a portion of the regular power supply of the television receiver, from some of the remaining stages of the fine tuning indicator. The switch 76 may conveniently be located on the control panel of the television receiver so that the user may easily open and close the switch for the fine tuning operation. The closing of the switch 76 provides operating voltage to the various switching and gating stages of the fine tuning indicator 10.

An output 80 from the output of the IF amplifiers 20 is applied to a slope detector 82 of the fine tuning indicator 10. The frequency of the signal appearing at the lead 80 as applied to the slope detector 82 is determined by the tuned condition of the tuner 16. If the tuner is properly set to the frequency of the incoming television signal, the intermediate frequency output appearing at the lead 80 should be at the standard intermediate frequency signal of 45.75 mHz. If the tuner is off frequency the signal appearing at the lead 80 will be either above or below the desired intermediate frequency. The slope detector 82 is designed to have a frequency characteristic so as to provide a given output voltage when an intermediate frequency of 45.75 mHz. is received and a greater output voltage when a higher frequency signal is received and a smaller output voltage when a lower frequency signal is received. Thus, the output appearing at an output 84 of the slope detector 82 is indicative of whether the tuner 16 is properly fine tuned or tuned to too high or too low a frequency.

Also included in the fine tuning indicator 10 is a video peak detector 122 which is supplied an input from the first video amplifier 26 via a lead 124. The output of the video peak detector 122 is applied via a lead 126 to the output 84 of the slope detector 82. The function of the video peak detector 122 is to compensate for any changes in the picture carrier level at the input to the slope detector 82. If such compensation were not provided, the DC control voltage developed at the output of the peak detector 88 would not only be a function of the intermediate frequency picture carrier frequency, but also of its amplitude. For strong and moderate level received signals, the automatic gain control system of the television receiver maintains the intermediate frequency picture carrier at a relatively constant amplitude at the input of the slope detector 82. However, for received signals below the threshold level of the AGC system, the IF picture carrier level will decrease and thus so will the DC control voltage. To compensate for this, the amplitude level of the intermediate frequency picture carrier is monitored by the video peak detector 122, with the DC output thereof at the lead 126 being added in opposite polarity to the output of the slope detector 82 at the lead 84. Thus, relatively good tracking is achieved so that the DC control voltage remains relatively constant at correct tuning at high signal levels down to those approaching zero level.

The frequency dependent output at the output 84 is applied to a buffer amplifier 86 where it is amplified and applied to a peak detector 88. The output of the peak detector 88 appearing at a lead 90 is indicative of the tuned state of the tuner 16 and supplies a control voltage which has a predetermined value at correct fine tuning and a higher value or a lower value depending upon if the tuned frequency of the tuner 16 is below or above that of the desired frequency. The output 90 of the peak detector then supplies the control voltage which is applied to a gate circuit 92. Also supplied as an input to the gate circuit 92 is a reference voltage developed at a lead 94. This reference voltage is provided by a reference circuit 96 which is connected between the operating source 78 and the gate 92. The magnitude of the reference voltage provided at the lead 94 may be adjusted through the reference circuit 96. The gate circuit 92 is operative to supply either the control voltage or the reference voltage at its output 98 in response to a gating signal applied at in input 100 thereto. The gating signal at the lead 100 is supplied by a bistable multivibrator 102, which is in turn activated by vertical retrace pulses which are supplied from the vertical output 54 stage through a lead 104 to a differentiator 106. The vertical retrace pulses are differentiated therein to provide a differentiated signal at the output 108 which is supplied to the bistable multivibrator 102. The bistable multivibrator 102 changes states in response to the differentiated signal supplied thereto. The bistable multivibrator 102 thus changes at the picture field rate of scan and thus will maintain one state during a first field of scan and a second state during a second field of scan. This will permit the gate circuit 92 to provide the control voltage appearing on the lead 90 to the output lead 98 during one field of scan and then during the next field of scan the reference voltage appearing at the lead 94 will be applied to the output lead 98. Hence, during alternate fields of scan the control voltage and the reference voltage respectively are applied to a comparator 110.

The comparator 110 may comprise a monostable multivibrator, but is given the title comparator herein since the control voltage or reference voltage appearing at the lead 98 is compared therein with an internally generated predetermined voltage and supplies an output voltage at its output 112 which is time dependent upon the comparison made. This will be explained in further detail below. The comparator 110 changes state in response to horizontal retrace pulses applied thereto via a lead 115 which is taken from the flyback transformer 68. The comparator 110 being a monostable device thus changes states normally at the horizontal retrace rate but the timing to revert to its stable state is controlled by the comparison of the signal appearing on the lead 98, which is either the reference voltage or the control voltage, with an internally generated voltage. The comparator 110 is so designed that it will change to its stable state sometime during the horizontal scanning period. In the case when the reference signal is compared with the internally generated voltage, the comparator will change to its stable state at a predetermined time during the horizontal scanning period. However, during the next field of scan when the control voltage is supplied to the comparator 110, the time at which the comparator reverts to its stable state will be dependent upon the magnitude of the control voltage which is in turn a function of the tuned state of the tuner 16. Thus, if the tuner 16 is tuned to too low a frequency, the comparator 110 will revert to its stable state at a time period before that caused by the reference voltage. On the other hand, if the tuned frequency is too high, the comparator will not return to its stable state until a time period later than does the reference voltage cause the return. However, if the fine tuning control 18 of the tuner 16 is so adjusted that the tuner is accurately tuned to the carrier frequency of the incoming television signal, the control voltage will be of such a magnitude as applied to the comparator 110 as to cause the comparator 110 to revert to its stable state at the same time during the horizontal scanning period as does the reference voltage.

The output 112 of comparator 110 is applied to a differentiator 114 which is responsive to the change of the comparator from its unstable to its stable state and thus provides a spike output to a monostable multivibrator 116 from its output 118 at the time of the reversion to the stable state. In response to the output 118, the monostable multivibrator 116 provides pulses at its output 120 which are termed herein video gating pulses. The video gating pulses may have a fixed time duration as determined by the time constant of the monostable multivibrator 116, which may, for example, be one or two microseconds. The video gating pulses thus have a time position in the horizontal scanning cycle which is determined by the reference voltage and the control voltage during alternate fields of scan respectively. Hence, during the field of scan when the reference voltage is applied to the comparator 110, the monostable multivibrator 116 provides video gating pulses having a fixed time position in the horizontal scanning cycle; while during the field when the control voltage is applied to the comparator 110, the monostable multivibrator 116 provides video gating pulses which have a variable time position.

Video gating pulses at the lead 120 are applied to the video gating circuit 32 and in response thereto the video gating circuit is gated on to translate these pulses therethrough to the output lead 34 of the video gating circuit 32. The video gating pulses are then applied to the second video amplifier 36 and thence to the picture tube 12 for display thereon at the time of their occurrence in the horizontal scanning period.

Figure 3:
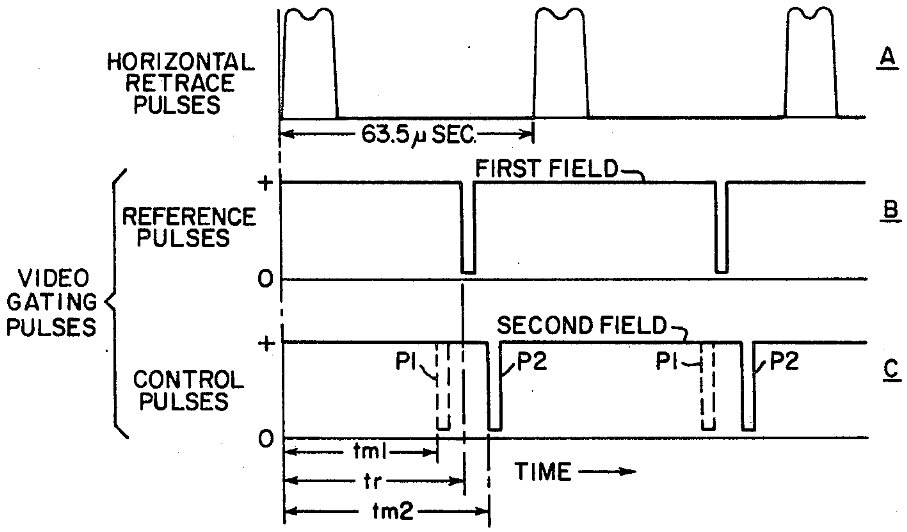
FIG. 3 is a waveform diagram including curves A, B and C which are used in explaining the operation of the present invention.

FIGS. 2A, 2B and 2C illustrate the display which will appear on the screen of the picture tube 12 in response to video gating pulses as described. Reference is also made to FIG. 3 which shows in curve A thereof the horizontal retrace pulses which act as a time reference. Curves B and C of FIG. 3 show the video gating pulses provided by the monostable multivibrator 116. FIG. 2A shows a reference line which is stationary being generated in response to the video gating pulse shown in curve B of FIG. 3 and designated as reference pulses. It can be seen that the pulses in curve B of FIG. 3 occur at a time *tr* from the beginning of a horizontal retrace pulse with this time being constant for each occurrence of the reference pulses. Also in FIG. 2A, a control line which is movable is shown displayed to the left of the reference line. This control line is generated in response to pulses P1 as shown in dotted lines of curve C of FIG. 3 which occur during a second field at a time *tm*1 from the beginning of the horizontal retrace pulse. The time at which pulses P1 occur in the horizontal scanning cycle is variable and dependent upon the tuned frequency of the tuner 16. By adjusting the fine tuning control 18 of the tuner 16, the control line can be brought into coincidence with the reference line as shown in FIG. 2B. The coincidence of the reference and control lines thus indicates visually that the fine tuning has been accurately set for the receiver. When the lines coincide this is indicative that the reference pulses and the control pulses as shown in curves B and C of FIG. 3, respectively, are in time coincidence also.

FIG. 2C shows the control line to be to the right of the reference line. In this instance, control pulses P2 have been supplied to the picture tube which occur at a time *tm*2, which is later in the horizontal scanning period than the reference pulses appear. This thus causes the control lines to be presented to the right of the reference line. For the control line to be moved to be in coincidence with the reference line, it is necessary that the fine tuning control be adjusted in a direction so that the control pulses will be in time coincidence with the reference pulses as shown in curves B and C of FIG. 3.

The video gating pulses are shown to go from a positive voltage to a ground level voltage. Thus, the reference and control lines as displayed on the picture tube will be at a black level and thus will be readily observable. During the interval between video gating pulses, the output 28 from the first video amplifier 26 is translated through the video gating circuit 32 and applied to the second video amplifier 36. Thus, normal transmitted picture is also applied to the picture tube 12 for display thereon so that the viewer can also view the received video information as well as the control and reference lines displayed on the tube as an additional aid in fine tuning.

Figure 5:
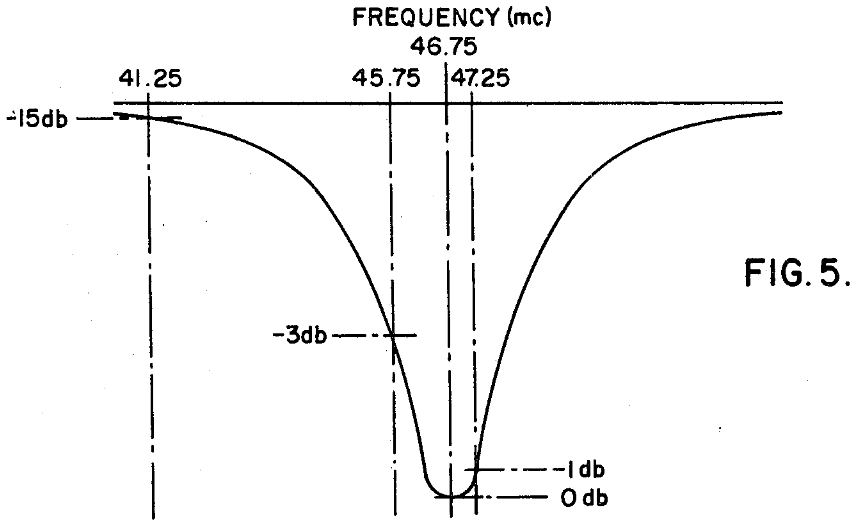
FIG. 5 is a plot of the response characteristic of the slope detector as utilized herein.
Figure 4:
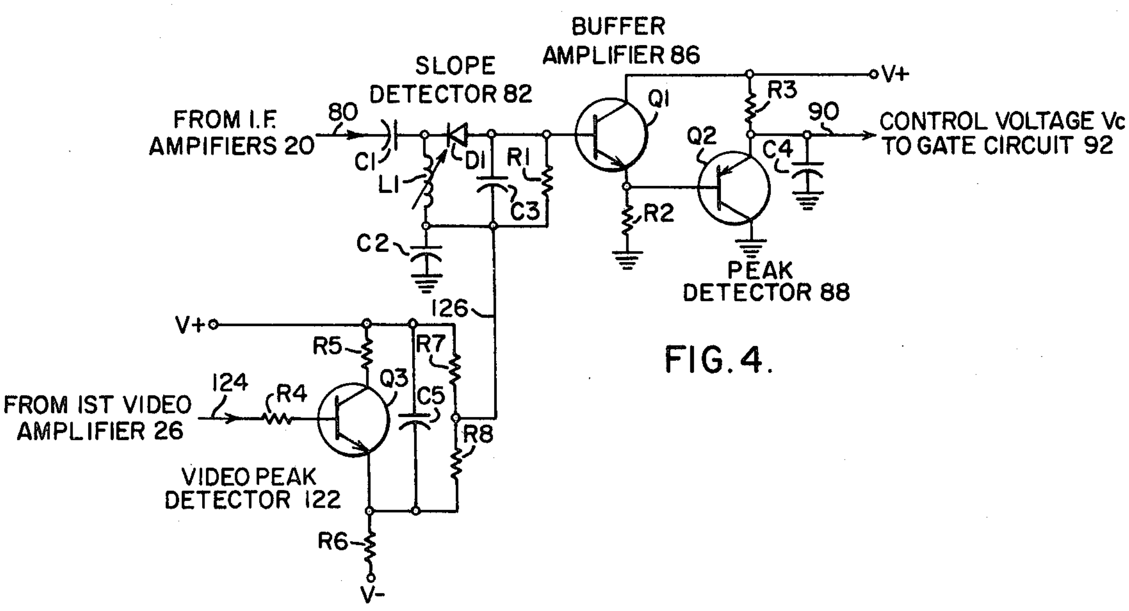
FIG. 4 is a schematic diagram of a portion of the fine tuning indicator shown in block form in FIG. 1.

Referring now to FIG. 4, a schematic diagram of the circuitry which can be utilized for the slope detector 82, the buffer amplifier 86, the peak detector 88 and the video peak detector 122 is shown. The intermediate frequency picture carrier from the intermediate amplifiers 20 is applied via the lead 80 to the slope detector 82 which includes a capacitor C1 having one end connected to the lead 80 and the other end connected to the cathode of a diode D1. A series combination of a variable inductor L1 and a capacitor C2 is connected between the junction of the capacitor C1 and the diode D1 and ground. A capacitor C3 is connected between the anode of the diode D1 and the junction between the inductor L1 and the capacitor C2. A resistor R1 is connected directly across the capacitor C3. The slope detector 82, as described, is a high Q tuned type and has a characteristic as shown in FIG. 5. The center frequency of the slope detector as shown in FIG. 5 is set to peak at approximately 46.75 mHz., while the correct intermediate frequency picture carrier frequency of 45.75 mHz. is positioned on the left slope of the curve. Thus, as the intermediate frequency picture carrier frequency varies above and below the correct value of 45.75 mHz., the output of the slope detector 82 is a function of the frequency.

The slope detector peaks at a frequency of approximately 1 mHz. above that of the desired frequency, thus the control voltage is developed in the fine tuning range of approximately plus or minus 1 mHz. around 45.75 mHz. In FIG. 5, the adjacent sound carrier at correct tuning of 47.25 mHz. is shown high on the response curve; however, its signal level is attenuated by the selective video intermediate frequency response which normally includes an adjacent sound trap.

The detected output of the slope detector 82 is applied to the base electrode of a transistor Q1 of the buffer amplifier 86. The buffer amplifier 86 is connected as an emitter follower with an emitter resistor R2 connected between the emitter electrode thereof and ground. The collector electrode is connected to a source of operating potential V+. The output of the buffer amplifier 86 is taken from the emitter electrode of the transistor Q1 and applied to the base electrode of a transistor Q2 of the peak detector 88. The collector of the transistor Q2 is grounded, while the emitter thereof is coupled through a resistor R3 to the V+ source. A capacitor C4 is connected between the emitter electrode and ground with the output of the peak detector taken from the lead 90 connected at the emitter of the transistor Q2.

The video peak detector 122 is operative to compensate when low amplitude input signals are received. The peak detector 122 includes a transistor Q3, the video signals from the first video amplifier 26 being applied via the lead 124 through a resistor R4 to the base electrode of the transistor Q3. The collector of the transistor Q3 is connected through a resistor R5 to the V+ source, and the emitter electrode thereof is connected through a resistor R6 to a source of negative potential V−. A capacitor C5 is connected between the V+ source and the emitter electrode of the transistor Q3, and across the capacitor C5 is connected a voltage divide network including a resistor R7 and a resistor R8. The lead 126 connects the junction point between the resistors R7 and R8 to the bottom end of the resistor R1 which has its other end connected to the base of the buffer amplifier transistor Q1.

The intermediate frequency signal from the lead 80 is applied to the high Q series tuned circuit including the capacitor C1 and the variable coil L1. The voltage developed across the coil L1 is thus Q times that appearing at the lead 80 with respect to ground. The tuned circuit is peaked at approximately 46.75 mHz. as shown in FIG. 5 by the adjustment of the coil L1. The signal is then detected by the diode D1 and filtered by the capacitor C3. This then produces a negative going video signal developed across the load resistor R1. The capacitor C2 connected between the bottom end of the resistor R1 and ground acts as a high frequency by-pass. At proper tuning of the tuner 16 as shown in FIG. 1, a predetermined output will be developed across the load R1 which will be a greater voltage for high tuning and a smaller voltage for low tuning of the fine tuning control.

The video peak detector 122 as previously mentioned is used to compensate for signal level changes at the last intermediate frequency amplifier stage. Video signals from the first video amplifier 26 are supplied via lead 124 through an isolating resistor R4 to the base of the transistor Q3. The transistor Q3 is connected as an emitter follower with the emitter thereof following the peak of the video signal at the base due to the connection of the capacitor C5 between the emitter and the V+ source. The emitter of the transistor Q3 is then connected through the voltage divider including the resistors R7 and R8 to the bottom of the resistor R1 in the slope detector.

Assuming that no signal is being received by the television receiver, the video peak detector transistor Q3 is non-conductive and the direct voltage at the base of the buffer amplifier transistor Q1 is determined by the voltage divider network including the resistors R6, R8 and R7 and the load resistor R1. With no signal being received, there is no negative voltage developed by the slope detector 82. With no signal input, the DC voltage appearing at the base of the transistor Q1 may thus be adjusted by the selection of the resistors previously mentioned. For increasing signal levels, the peak signal output of the slope detector 82 increases in a negative direction, while the output of the video peak detector increases in the positive direction. Thus, these output voltages track each other. However, since these voltages are of the opposite polarity, the voltage appearing at the output lead 90 remains substantially constant independent of the amplitude of the received television signal. Alignment of the tuned circuit of the slope detector is adjusted for best tracking at the correct fine tuning position for the received television signal.

The buffer amplifier 86 is connected in an emitter follower configuration and acts as an isolation stage for the tuned circuit of the slope detector. The emitter of the transistor Q1 thus follows the voltage applied to the base thereof and is connected to the base of the transistor Q2. The buffer amplifier is utilized to isolate the peak detector 88 from the high Q slope detector and thus prevent loading on the tuned circuit thereof. The capacitor C4 connected between the emitter of the transistor Q2 and ground enables the circuit to operate as a peak detector with the DC voltage being developed at the lead 90 being the control voltage as previously discussed. The peak detector transistor Q2 is connected as an emitter follower, and, the control voltage appearing at the emitter thereof has a predetermined value for the correct fine tuning position and may vary above and below this predetermined value for high and low mistuning of the television receiver.

Figure 6:
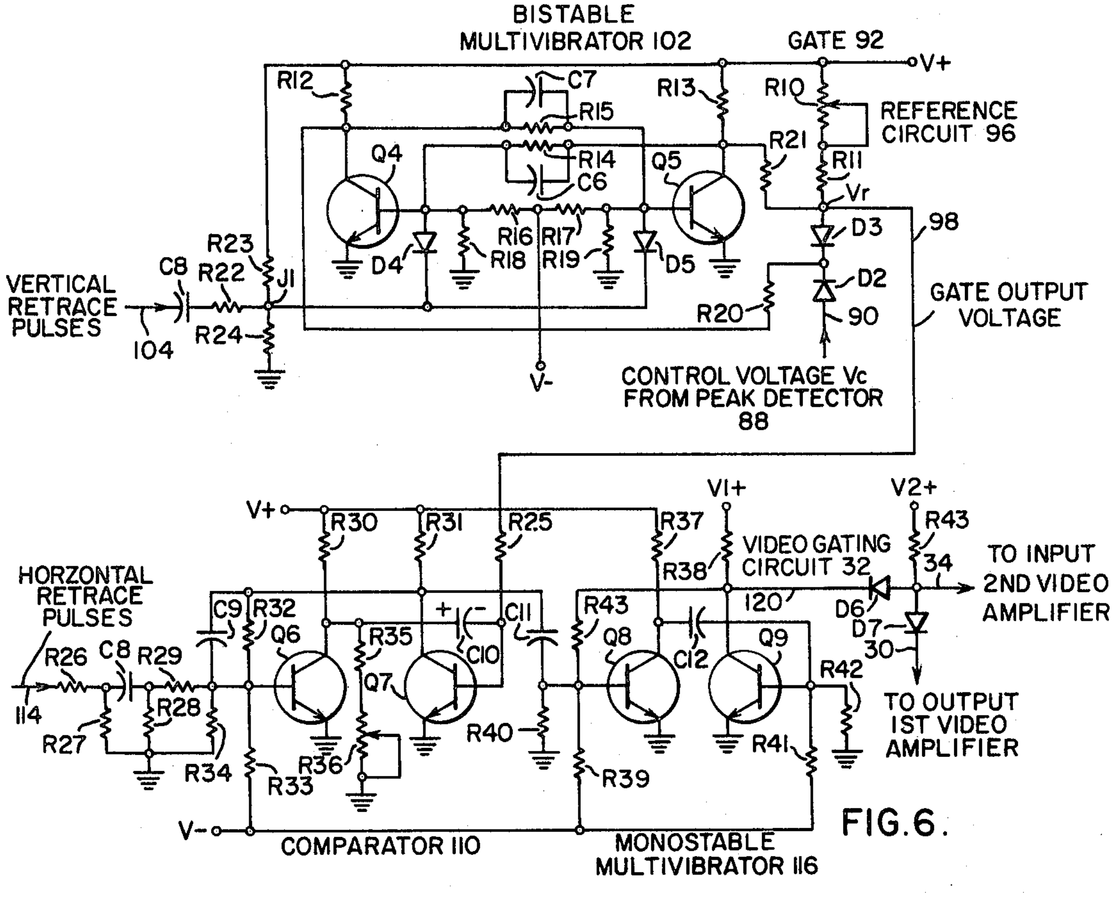
FIG. 6 is a schematic diagram of a portion of the fine tuning indicator shown in block form in FIG. 1.

Referring now to FIG. 6, the remaining portions of the fine tuning indicator circuit will be described. The control voltage appearing on the output lead 90 of the peak detector 88 is applied to the gate circuit 92. The function of the gate circuit 92 is to permit the comparator circuit 110 to monitor two different signals in a time sharing mode. During a first time period (one picture field), the gate circuit 92 presents to the comparator 110 the reference voltage. During a second time period (the next picture field), the comparator 110 due to the action of the gate 92 is presented with the control voltage which is a function of fine tuning setting as previously discussed.

The gate circuit 92 includes a pair of diodes D2 and D3 and a suitable biasing system for the switching of these diodes. The control voltage, designated herein $V_c$, from the lead 90 is applied to the anode of the diode D2. The cathode electrodes of the diodes D3 and D2 are connected with the output of the gate circuit 92 being taken from a lead 98 connected to the anode of the diode D3. The reference voltage, which will be designated $V_r$, is developed by the reference circuit 96 which includes a potentiometer R10 and a fixed resistor R11 which are connected in series between the V+ source and the anode of the diode D3, and resistor R21 which is connected between the anode of D3 and the collector of transistor Q5 of the bistable multivibrator. Thus, the control voltage $V_c$ is applied to the anode of the diode D2 and the reference voltage $V_r$ is applied to the anode of the diode D3 of the gate circuit 92. The magnitude of the reference voltage $V_r$ may, of course, be adjusted by the reference potentiometer R10. The switched state of the gate circuit 92 is controlled by the bistable multivibrator 102 which is in turn triggered by vertical retrace pulses which are applied to the differentiator 106 through a lead 104. The bistable multivibrator 102 changes states in response to the vertical retrace pulses and thus establishes the switching rate for the diode gate 92 to be at the vertical scanning rate of 60 Hz.

The bistable multivibrator 102 includes a first transistor Q4 and a second transistor Q5. The bistable circuit 102 is of a standard design and includes the resistor R12 connected between the collector of the transistor Q4 and the V+ source, and a resistor R13 connected between the collector of the transistor Q5 and the V+ source. The emitter electrodes of the transistors Q4 and Q5 are grounded. The parallel combination of a resistor R14 and a capacitor C6 is connected between the base of the transistor Q4 and the collector of the transistor Q5. The parallel combination of a resistor R15 and capacitor C7 is connected between the base of the transistor Q5 and the collector of the transistor Q4. A resistor R16 is connected between the base of transistor Q4 and a source of negative polarity potential V−, while a resistor R17 connects the base of the transistor Q5 and the V− source. Resistors R18 and R19 are connected, respectively, between the base of the transistor Q4 and ground and the base of the transistor Q5 and ground to complete the voltage division from the V− source. A resistor R20 is connected between the collector of the transistor Q4 and the junction point between the cathodes of the diodes D2 and D3 of the gate 92.

Assume that the transistor Q4 of the bistable multivibrator 102 is turned on while the transistor Q5 is turned off. At this time the collector of the transistor Q4 is essentially at ground potential and therefore grounds one end of the resistor R20. Since the transistor Q5 is nonconductive, the collector thereof, which is connected through a resistor R21 to the anode of the diode D3 of the gate 92, is essentially at the V+ potential. The control voltage *Vc*, which is applied to the anode of the diode D2, is of a positive polarity and is normally selected to be somewhat less than the V+ potential. Thus, under these conditions, both diodes D2 and D3 are forward biased, with the anode electrodes thereof positive with respect to the cathode electrodes, which are, therefore, both in conduction mode. The signal translated by the gate circuit 92 with the transistor Q4 conductive is thus essentially the control voltage *Vc*. This is the case, because the control voltage *Vc* is fed to the anode of the diode D2 of the gate circuit 92 from a low impedance source (the emitter electrode of the peak detector transistor Q2) and the voltage drop across the diodes D2 and D3 tend to cancel because of their opposed polarities. Thus, during this portion of the cycle, the control voltage *Vc* is applied via the lead 98 to the comparator circuit 110.

The switched state of the bistable multivibrator is changed in response to vertical retrace pulses being applied via the lead 104 to a differentiating circuit 106 which includes a capacitor C8 connected in series with the lead 104. A resistor R22 is connected in series with the capacitor C8. A voltage divide network including a resistor R23 and a resistor R24 is provided and connected between the V+ source and ground, with the resistor R22 being connected to the junction J1 between the resistors R23 and R24. A diode D4 is connected anode-to-cathode between the base of the transistor Q4 and the junction J1, and a diode D5 is connected anode-to-cathode between the base of transistor Q5 and the junction J1.

Figure 7:
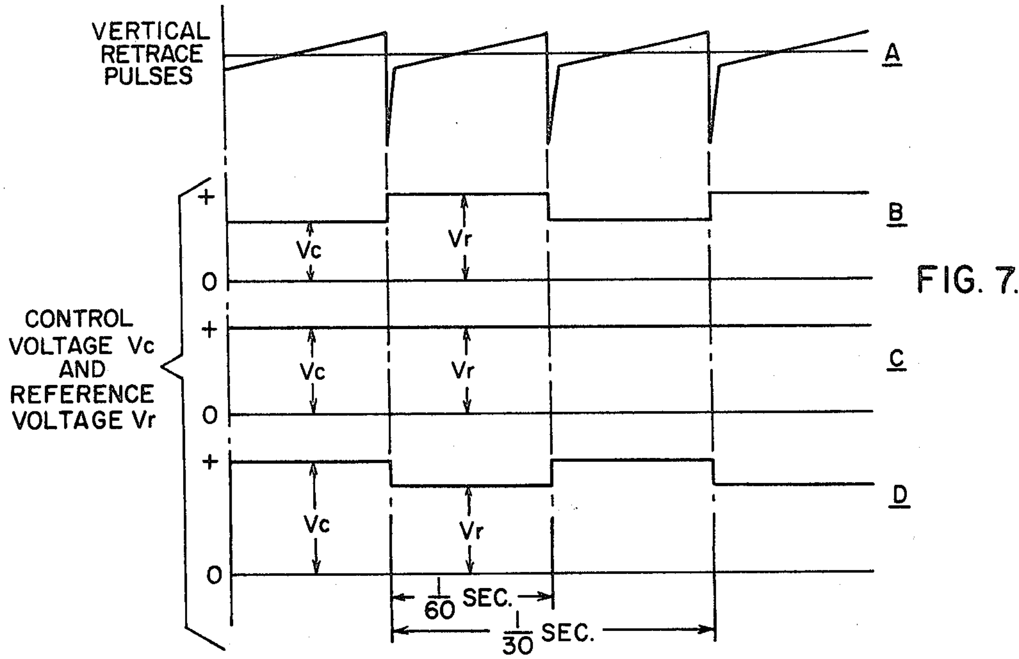
FIG. 7 is a waveform diagram including curves A, B, C and D which are used in explaining the operation of the present invention.

Vertical retrace pulses, such as shown in curve A of FIG. 7, are applied to lead 104 and are differentiated and applied via the diodes D4 and D5, respectively, to the base electrodes of the transistors Q4 and Q5. Still presuming the transistor Q4 is on the transistor Q5 is off. Upon the application of a differentiated vertical retrace pulse, the transistor Q4 will be turned off by the negative polarity pulse passing through the diode D4, and the transistor Q5 will then be turned on. Subsequent vertical retrace pulses will of course change the switched state of the bistable multivibrator 102. With the transistor Q4 being turned off, the collector electrode thereof goes essentially to the V+ potential which causes each of the diodes D2 and D3 to be reversed biased since the cathodes thereof are held essentially at the V+ potential also. The output of the gate circuit 92 is now determined by the voltage divide network which includes the potentiometer R10, the fixed resistor R11 and the resistor R21, which is connected between the anode of the diode D3 and the collector of the transistor Q5, which is essentially at ground potential. The potential appearing at the anode of the diode D3, is the reference voltage V*r* which is then applied via the lead 98 to the comparator 110.

FIG. 7 shows the gate output voltage at lead 98 in correlation with the vertical retrace pulses for various relationships of the control voltage V*c* and the reference voltage V*r*. Curve B of FIG. 7 shows the condition when the control voltage V*c* is smaller than the reference voltage V*r*. Curve C shows the condition when the reference voltage and the control voltage are equal, and curve D shows the condition when the control voltage V*c* is larger than the reference voltage. It can also be seen from FIG. 7 that the control voltage V*c* is applied for a period of time equal to one picture field while the reference voltage V*r* is applied during the next picture field.

The control voltage V*c* and the reference voltage V*r* developed at the output lead 98 of the gate circuit 92 are then applied to the comparator 110, with the control voltage V*c* being applied for one field of scan and then the reference voltage V*r* being applied during the next field of scan. The comparator 110, as shown in FIG. 6, is a monostable multivibrator and includes a first transistor Q6 and a second transistor Q7. The gate output voltage from the lead 98 of the gate circuit 92 is applied to the base electrode of the transistor Q7 through a resistor R25. The comparator 110 is operative so that the transistor Q6 is normally off and the transistoɪ Q7 is normally on. Transistor Q6 is turned on in response to a horizontal retrace pulse being applied via the lead 114 thereto. The horizontal retrace pulse is divided down by the resistor network including the resistor R26 connected to the lead 114 and resistor R27 connected between the other end of the resistor R26 and ground. The horizontal retrace pulse then passes through a capacitor C8 which has one end connected to a resistor R26 and the other end connected to the junction point between a resistor R28 and a resistor R29. The other end of the resistor R28 is grounded and the other end of the resistor R29 is connected to the base electrode of the normally turned off transistor Q6. The application of the horizontal retrace pulse to the base electrode of the transistor Q6 caused it to be turned on, and then the normally conductive transistor Q7 is turned off. The emitter electrodes of the transistors Q6 and Q7 are grounded, while the collector electrodes thereof are, respectively, connected through resistors R30 and R31 to the V+ source. The parallel combination of a capacitor C9 and a resistor R32 is connected between the collector of the transistor Q7 and the base of the transistor Q6. A voltage divide network including a resistor R33 and R34 is provided with the resistor R33 being connected between the V− source and the base of transistor Q6, and the resistor R34 being connected between the base and ground. A reference capacitor C10 is connected between the collector of the transistor Q6 and the base of the transistor Q7. During the period when the transistor Q6 is in its normal non-conductive state, the capacitor C10 charges, to the polarity as indicated, to a voltage level Vc10 as determined by the voltage divide network including the resistor R30 connected between the V+ source on the positive end of the capacitor C10, a fixed resistor R35, having one end connected to the positive end of the capacitor C10, and to a potentiometer R36 connected between the resistor R35 and ground.

When the transistor Q6 receives a horizontal retrace pulse and is turned on, the plus end of the capacitor C10 is essentially grounded being connected to the collector of the transistor Q6. The transistor Q7 of the comparator 110 is turned off and remains in a non-conductive state by the charge on the capacitor C10 until it discharges sufficiently through the resistor R25 to the level of the voltage appearing on the lead 98, which is the gate output voltage as previously discussed. When the capacitor C10 has sufficiently discharged, the comparator will revert back to its normal state with the transistor Q6 non-conductive and the transistor Q7 conductive, and will remain so until the next horizontal retrace pulse is applied to the base of the transistor Q6.

The component values for the comparator 110 are selected so that the comparator will revert back to its normal state between successive horizontal retrace pulses. The time at which the comparator reverts to its normal state may be adjusted by adjusting the voltage Vc10 across capacitor C10 via the potentiometer R36. The time of reversion to the normal state is also a function of the gate output voltage appearing on the lead 98 which is either the control voltage V*c* or the reference voltage V*r*.

Figure 8:
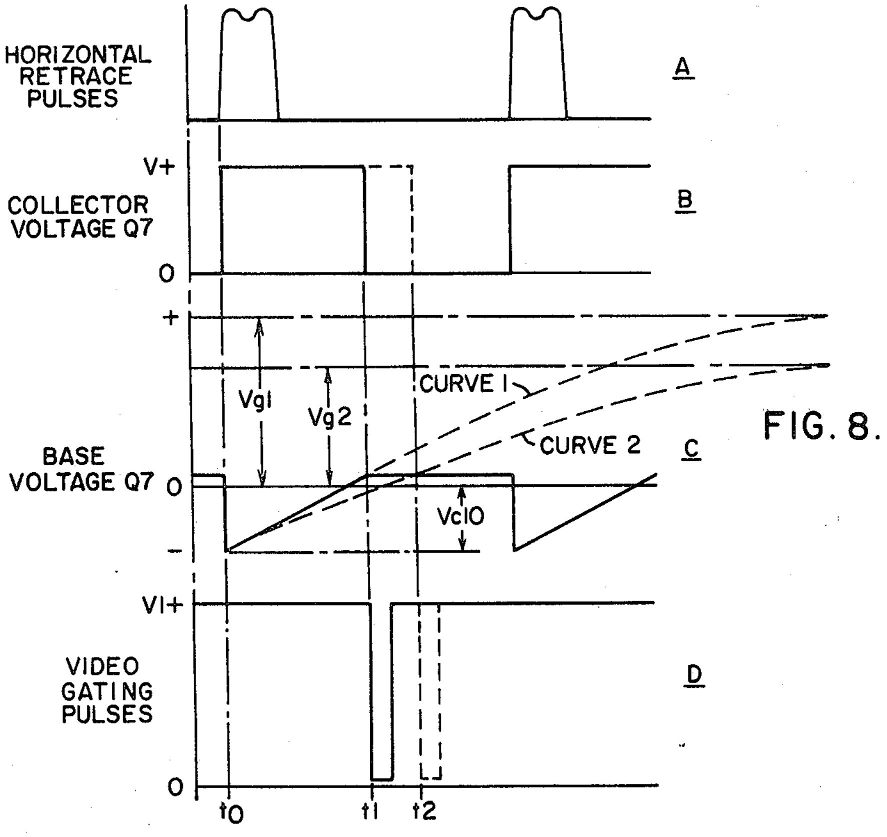
FIG. 8 is a waveform diagram including curves A, B, C and D also used in explaining the operation of the present invention.

Reference is also made to FIG. 8 which illustrates the operation of the comparator 110. Curve A of FIG. 8 shows horizontal retrace pulses which are applied to the lead 114, divided down in voltage amplitude and then applied to the base of the transistor Q6 to render this transistor conductive at the time *t*0 as shown in FIG. 8. At the time *t*0 the transistor Q7 is turned off with the collector thereof rising in voltage to essentially the V+ potential. A plot of the collector voltage of the transistor Q7 is shown in curve B of FIG. 8. Curve C of FIG. 8 shows the base voltage of the transistor Q7. The voltage Vc10 is shown thereon and it is indicated as a negative polarity voltage which is developed across the capacitor C10 and is shown thereon to be of a fixed value for the purposes of clarity; however, it may be adjusted through the potentiometer R36. Also shown in curve C of FIG. 8, are voltages indicated V*g*1 and V*g*2. These are indicative of two different gate output voltage levels appearing at the lead 98, and applied via the resistor R25 to the base electrode of the transistor Q7. The voltage V*g*1 is shown to be of a greater positive amplitude than the voltage V*g*2.

Once the transistor Q6 is rendered conductive, the capacitor C10 begins to discharge through the resistor R25 to either the level V*g*1 or V*g*2 depending upon the output of the gate circuit 92. Assume for purposes of explanation that at the time *t*0 that the gate output voltage level is V*g*1. Then the capacitor C10 will discharge to the voltage level V*g*1 along a curve 1 as indicated in curve C. The transistor Q7 will be biased off by the voltage applied to the base thereof until a time *t*1 when the curve 1 goes slightly positive, indicating that the base voltage is positive with respect to the emitter which is at ground level. At this time the transistor Q7 will begin conducting again and the comparator 110 will revert back to its normal state with the transistor Q6 being maintained in its normal non-conductive state. Because of the relatively high magnitude of the gate output voltage of V*g*1, the base voltage of the transistor Q7 goes positive at a relatively early time *t*1 as can be seen in FIG. 8. However, now assume that at the time *t*0 that the gate output voltage is at a lower value of V*g*2 as shown in curve C of FIG. 8. At the time *t*0, the capacitor C10 will begin to discharge toward the voltage level V*g*2 according to a curve 2 as shown in curve C of FIG. 8. The curve 2 does not go to a slightly positive value until a time *t*2, which is somewhat later than the time *t*1. Thus, the transistor Q7 reverts to its normal conducting state at a later time measuring from the beginning of the horizontal retrace pulse for the case when the gate output voltage is V*g*2 than for the case when the gate output voltage is V*g*1. In curve B of FIG. 8, the solid line indicates the turning on of the transistor Q7 at the time *t*1 and the dotted line indicates the turning on of the transistor Q7 at the time *t*2. Thus, taking the collector voltage of the transistor Q7 as being the output of the comparator 110, the time at which the transistor Q7 will revert to a zero output state when turned on may be controlled by the magnitude of the gate output voltage. As previously discussed, the gate output voltage is either the control voltage V*c* or the reference V*r* as illustrated in curves B, C and O of FIG. 7.

The useful portion of the output of the comparator is the negative going portion at the end of the pulse from V+ to zero. The time of occurrence of the negative going portion varies in accordance with the gate output V*r* or V*c* as previously explained. The negative going portion of the pulse is differentiated by a capacitor C11 which is connected between the collector of the output transistor Q7 of the comparator 110 and the base of a first transistor Q8 of the monostable multivibrator 116. The monostable multivibrator 116 includes a second transistor Q9 which is normally in its turned off state, while the transistor Q8 is normally in its turned on state. The emitters of the transistors Q8 and Q9 are grounded, and the collector electrode of the transistor Q8 is connected via a resistor R37 to the V+ source. The collector of the transistor Q9 is connected through a resistor R38 to a source of positive potential designated V1+, which is of a somewhat higher positive polarity than the V+ source. A voltage divide network including a resistor R39 and a resistor R40 is connected between the V− source and ground, with the junction therebetween connected to the base of the transistor Q8. A voltage divide network including a pair of resistors R41 and R42 is connected between the V− source and ground with the junction therebetween connected to the base of the transistor Q9. A resistor R43 is connected between the base of the transistor Q8 and the collector of the transistor Q9 with the output of the monostable multivibrator 116 being developed at the collector of the transistor Q9 at the lead 120. A capacitor C12 is connected between the collector of the transistor Q8 and the base of the transistor Q9 to complete the monostable multivibrator 116.

Transistor Q8 is turned off from its normally conductive state by the application of the differentiated output of the comparator 110 which is a negative going pulse. The application of this negative going pulse turns off the transistor Q8 and causes the transistor Q9 to be turned on, thus generating an output pulse at the collector of the transistor Q9 which appears at the lead 120. These output pulses may be termed video gating pulses and are illustrated in curve D of FIG. 8. The time duration of the video gating pulses is determined by the capacitance of the capacitor C12, resistor R37, and the bias network for the second transistor Q9. A typical time period for these pulses may be one or two microseconds. It can be seen in curve D of FIG. 8 that the output of the monostable multivibrator is normally at the potential V1+, but, when the transistor Q9 is turned on, the collector thereof goes to substantially zero potential and stays there until the monostable multivibrator 116 returns to its normal state with the video gating pulse terminating. As shown in curve D of FIG. 8, a pulse will be generated by the monostable multivibrator 116 at the time *t*1 in response to the transistor Q7 of the comparator 110 reverting to its normally conductive state at that time as shown in curves B and C of FIG. 8 if the gate output voltage is V*g*1. If, however, the comparator 110 is operative on the curve 2 as shown in curve C of FIG. 8, a video gating pulse is not generated until a time *t*2 as shown in curve D of FIG. 8 because of the base voltage conditions existing at the transistor Q7 of the comparator 110 as explained above. The video gating pulse generated as shown in curve D of FIG. 8, thus are time dependent upon the magnitude of the gate output voltage which is either the control voltage V*c* or the reference voltage V*r*. These video gating pulses are developed at the output of the monostable multivibrator 116 at the lead 120 and are so applied to the video gating circuit 32.

The video gating circuit 32 includes a diode D6, a diode D7 and a resistor R43. The cathode of the diode D6 is connected to the lead 120 which is the output of the monostable multivibrator 116, and the cathode of the diode D7 is connected to the lead 30 which is an output of the first video amplifier 26 as shown in FIG. 1. The anode electrodes of the diodes D6 and D7 are commonly connected, with the resistor R43 being connected between those cathode electrodes and a source of positive polarity voltage V2+, which may, for example, comprise the B+ potential of the television receiver. The output of the video gating circuit 32 is developed at the lead 34 which is connected at the anode electrodes of the diodes D6 and D7.

The video gating circuit 32 normally translates the output from the first video amplifier at the lead 30 through the diode D7 to the output lead 34 and then to the second video amplifier 36, since the diode D7 is normally forward biased by the resistor R43 being connected between the V2+ source and the anode of the diode D7. With no video gating pulse appearing at the lead 120 at the cathode of the diode D6, the cathode is essentially at the V1+ potential as shown in curve D of FIG. 8. Under these conditions the diode D6 is reverse biased since the anode of this diode is connected to the anode of the diode D7 and will be at somewhat less than the V1+ potential. Thus, the diode D6 will be blocking in the absence of a video gating pulse being applied via the lead 120 to the cathode thereof. When a video gating pulse such as shown in curve D of FIG. 8 is applied to the cathode of the diode D6, this diode will have its cathode held essentially at ground potential and will be conductive. The diode D7, however, will be reverse biased and therefore will block and prohibit the passage of video information from the first video amplifier via the lead 30 to pass through the video gating circuit 32. The video gating pulse, however, is translated through the diode D6 and the lead 34 to the second video amplifier 36. Since this signal is negative going it will turn off the second video amplifier 36 and thus also the picture tube 12. Therefore, when a video gating pulse is applied to the video gating circuit 32 a black spot will appear at that time in the horizontal scan. As previously explained, in response to the video gating pulses reference and control lines will be displayed on the screen of the picture tube 12 as shown in FIGS. 2A, 2B and 2C. By the adjustment of the fine tuning control of the television receiver, the reference line and the control line can be brought into coincidence as shown in FIG. 2B, which is indicative that the fine tuning of the television receiver has been accurately set to the carrier frequency of the incoming television signal. After the control line has been brought into coincidence with the reference line, the switch 76 of FIG. 1 is opened to disconnect the operating source 76 from the components of the fine tuning control 10, thus prohibiting the generation of video gating pulses therein. The normal video information will thus be translated through the video gating circuit 32 to the second video amplifier 36 and thence to the picture tube 12 for normal display thereon. If the user should desire to switch to a different television channel and fine tuning should be required for reception on this channel, the switch 76 could then be reclosed to activate the components of the fine tuning control 10 with the above sequence of operation repeated to fine tune accurately the receiver to the carrier frequency of the new television channel. Switch 76 is then reopened for normal operation of the receiver.

Although the present invention has been described with a certain degree of particularity, it should be understood that the present disclosure has been made only by way of example, and that numerous changes in the details of circuitry and the combination and arrangement of the components and elements can be resorted to without departing from the spirit and scope of the present invention.

We claim as our invention:

1. A fine tuning indicator circuit for use in a television receiver including a picture tube and a tuner having a fine tuning control for fine tuning said receiver to the frequency of incoming television signals; said fine tuning indicator circuit comprising:

reference means for providing a reference potential of a predetermined value;

control means for providing a control potential in response to the fine tuning control setting of said receiver;

generating means responsive to said reference potential for generating reference signals having a predetermined time position in the horizontal scanning period of said receiver during selected fields of scan, and responsive to said control potential for generating control signals having a variable position in the horizontal scanning period during selected fields of scan;

said variable position being determined by said control potential as an indication of the degree of mistuning of said tuner from the frequency of the incoming television signals;

said variable position being movable in time position in response to the adjustment of said fine tuning control of that said predetermined time position and said variable time position are coincident when said receiver is fine tuned to the frequency of the incoming television signals; and video gating means for applying said reference signals and said control signals to said picture tube to display thereon a reference line in response to said reference signals and a control line in response to said control signals, the alignment of said reference and control lines displayed on said picture tube being indicative of the correct fine tuning of said receiver.

2. The fine tuning indicator circuit of claim 1 wherein:

the selected field of scan for generating said reference signals is during a first field of scan, and the selected field of scan for generating said control signals is during a second field of scan.

3. The fine tuning indicator circuit of claim 2 wherein said generating means comprises:

generating gating means for receiving said reference potential and said control potential and providing these as an output during said first and second fields, respectively, comparing means for receiving the output of said generating gating means and comparing it with a predetermined potential to provide a compared output at a time position in the horizontal scanning period determined by the comparison of the output of said generating gating means and said predetermined potential; and monostable means responsive to said compared output to change states and provide said control signals and said reference signals.

4. A fine tuning indicator circuit of claim 3 wherein the television receiver includes means for generating vertical and horizontal retrace pulses, said generating means including:

bistable means responsive to said vertical retrace pulses and operative to control said generating means so as to provide said reference signals and said control signals as an output during said first and second fields respectively;

said comparing means being responsive to said horizontal retrace pulses to provide said compared output in time correlation with said horizontal retrace pulses.

5. The fine tuning indicator circuit of claim 2 wherein:

said control means including, a slope detector having a response characteristic to provide a detected output having a predetermined amplitude when said television receiver is properly fine tuned and deviating above and below this amplitude when improperly fine tuned, said control potential being provided in response to said detected output.

6. The tuning indicator circuit of claim 5 wherein the television receiver includes a video channel having intermediate frequency amplifying, video detecting and video amplifying stages to supply video output information therefrom, said control means including:

a video peak detector responsive to the output of a video amplifying stage to provide a peak detected output in response thereto and of opposite polarity to said sloped detector output, means for combining said detected output and said video peak detected output so that said control potential is substantially constant at correct fine tuning of said receiver independent of amplitude of incoming television signals.

7. The fine tuning indicator circuit of claim 6 wherein said generating means including:

generating gating means for receiving said reference potential and said control potential and providing these as an output during said first and second fields, respectively, comparing means for receiving the output of said generating gating means and comparing it with a predetermined potential to provide a compared output at a time position in the horizontal scanning period determined by the comparison of the output of said generating gating means and said predetermined potential, and monostable means responsive to said compared output to change states and provide said control signals and said reference signals.

8. The fine tuning indicator circuit of claim 7 wherein:

said video gating means receiving said video information and normally applying said information to said picture tube for displaying thereon except when said reference or control signals are applied to said video gating means.

9. The fine tuning indicator circuit of claim 8 wherein the television receiver including at least two video amplifying stages and wherein:

said video gating means operatively connected between two of said video amplifying stages, and said reference signals and said control signals being of such a polarity so as to turn off the second of said video amplifying stages with a black reference or control line being displayed on said picture tube in response thereto.

References Cited

UNITED STATES PATENTS

| | | | |
|---|---|---|---|
| Re. 22,000 | 1/1942 | Anderson | 334—33 |
| 2,503,073 | 4/1950 | Schreiner | 178—5.8 |
| 2,904,630 | 9/1959 | Bruch et al. | 178—5.8 |
| 2,990,447 | 6/1961 | Stark et al. | 178—5.8 |

ROBERT L. GRIFFIN, Primary Examiner

R. P. LANGE, Assistant Examiner

U.S. Cl. X.R.

178—5.4; 334—33